US009899734B2

(12) United States Patent
Onaka et al.

(10) Patent No.: US 9,899,734 B2
(45) Date of Patent: Feb. 20, 2018

(54) FRONT END CIRCUIT AND WIRELESS COMMUNICATION DEVICE

(71) Applicant: Murata Manufacturing Co., Ltd., Kyoto (JP)

(72) Inventors: Kengo Onaka, Kyoto (JP); Hiroya Tanaka, Kyoto (JP); Hidenori Obiya, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 132 days.

(21) Appl. No.: 15/164,087

(22) Filed: May 25, 2016

(65) Prior Publication Data
US 2016/0268675 A1    Sep. 15, 2016

Related U.S. Application Data

(63) Continuation of application No. PCT/JP2014/080303, filed on Nov. 17, 2014.

(30) Foreign Application Priority Data

Nov. 28, 2013   (JP) .................................. 2013-246195

(51) Int. Cl.
*H04B 1/46*    (2006.01)
*H03H 7/40*    (2006.01)
(Continued)

(52) U.S. Cl.
CPC ................ *H01Q 1/50* (2013.01); *H03H 7/40* (2013.01); *H03H 7/463* (2013.01); *H04B 1/0458* (2013.01); *H04B 1/18* (2013.01)

(58) Field of Classification Search
CPC ........ H04B 1/006; H04B 1/04; H04B 1/0458; H04B 1/16; H04B 1/40; H04B 1/48; H03H 7/38; H03H 7/40; H03H 7/465; H03H 2007/386; H01Q 1/50; H01Q 5/335

USPC .................... 455/73, 78, 82, 83, 84
See application file for complete search history.

(56) References Cited

U.S. PATENT DOCUMENTS 7,279,979 B2 *  10/2007  Autti ..................... H03F 1/0205
                                                   330/285
8,665,579 B2 *   3/2014  Shimanouchi ........... H01G 5/16
                                                   361/270
(Continued)

FOREIGN PATENT DOCUMENTS

JP    H08-097733 A    4/1996
JP    2000-286924 A   10/2000
(Continued)

OTHER PUBLICATIONS

International Search Report issued in Application No. PCT/JP2014/080303 dated Feb. 24, 2015.
(Continued)

*Primary Examiner* — Quochien B Vuong
(74) *Attorney, Agent, or Firm* — Pearne & Gordon LLP

(57) ABSTRACT

A front end circuit includes a variable matching circuit connected to a diplexer and a switch connector connected between an antenna port and the diplexer. The variable matching circuit selectively connects matching circuits to a signal path. When one of the matching circuits is connected, the impedance as viewed from the switch connector matches an impedance of a measurement circuit near a normalized impedance of 1 in a predetermined communication band, whereas when the other matching circuit is connected, the impedance viewed from the antenna port conjugate-matches the impedance of an antenna circuit in a predetermined communication band.

17 Claims, 8 Drawing Sheets

(51) Int. Cl.
*H01Q 1/50* (2006.01)
*H03H 7/46* (2006.01)
*H04B 1/04* (2006.01)
*H04B 1/18* (2006.01)

(56) References Cited

U.S. PATENT DOCUMENTS

| | | | |
|---|---|---|---|
| 8,791,873 B2* | 7/2014 | Schmidhammer ... | H01Q 9/0407 343/860 |
| 9,231,552 B2* | 1/2016 | Taniuchi ................ | H03H 7/465 |
| 2009/0253385 A1 | 10/2009 | Dent | |
| 2012/0087282 A1 | 4/2012 | Shibahara | |
| 2016/0126982 A1* | 5/2016 | Hayafuji .............. | H04B 1/0483 370/328 |

FOREIGN PATENT DOCUMENTS

| | | |
|---|---|---|
| JP | 2005-020132 A | 1/2005 |
| JP | 2011-521508 A | 7/2011 |
| JP | 2013-168790 A | 8/2013 |
| WO | 2011/001769 A1 | 1/2011 |

OTHER PUBLICATIONS

Written Opinion issued in Application No. PCT/JP2014/080303 dated Feb. 24, 2015.

* cited by examiner

FRONT END CIRCUIT AND WIRELESS COMMUNICATION DEVICE

BACKGROUND

Technical Field

The present disclosure relates to a front end circuit and a wireless communication device in which an antenna is shared for signal transmission and signal reception in predetermined communication bands.

At present, wireless communication devices such as cellular phone terminals are configured to use multiple types of communication bands. A front end circuit is used in a wireless communication device in order to handle such a variety of communication bands using a single or a small number of antenna circuits. A front end circuit is typically provided with, for example, a shared antenna device that uses a circulator, a duplexer, a switchplexer, or the like, filters corresponding to the respective transmission signals and reception signals, and a switch connector for measuring the transmission output, reception sensitivity, and so on at an antenna port. The switch connector is an element to which a measurement circuit for measuring the transmission output, the reception sensitivity, and the like is connected during product testing, inspection, and so on, and has a function for switching the connection of the antenna port from the antenna circuit to the measurement circuit by connecting to a terminal of the measurement circuit.

To ensure matching with the measurement circuit, an antenna port provided with such a switch connector is configured to have a normalized impedance of 1 in a predetermined communication band. "Matching" as described hereinafter in this disclosure refers to a state where, for example, the voltage standing wave ratio (VSWR) of a connected circuit is less than 3.

An antenna circuit constituted of an antenna and an antenna matching circuit is also configured to have a normalized impedance near 1 in a predetermined communication band in order to ensure matching with the front end circuit. In the case of matching at 50Ω, for example, the normalized impedance of the front end circuit, the antenna circuit, or the like is obtained by dividing the impedance in question by 50Ω.

However, when an antenna circuit in a wireless communication device is near a human body or the like, the normalized impedance in the predetermined communication band can shift away from the vicinity of 1, making matching with the front end circuit difficult. Meanwhile, because wireless communication devices now handle a range of multiple communication bands, it has become difficult to set the normalized impedance of an antenna circuit to near 1 in all of the necessary communication bands. Furthermore, the development of carrier aggregation techniques that use multiple communication bands at different frequencies simultaneously has given rise to demand for the normalized impedance in an antenna circuit to be near 1 in each of multiple communication bands at mutually distant frequencies.

When the normalized impedance of an antenna circuit shifts away from the vicinity of 1, the transmission signal experiences an increased amount of reflection in the antenna circuit, and the reflected signal returns to a power amplifier. This may produce distortion in the transmission signal in the power amplifier, which in turn causes the transmission signal to degrade, produces abnormal oscillation in the power amplifier, damages the power amplifier, or the like. The reflected signal can also leak to the reception circuit side and cause a degradation in reception sensitivity. Accordingly, antenna circuits have been provided with antenna tuners (variable matching circuits), with the antenna tuners being controlled so that the normalized impedance in a predetermined communication band stays near 1 even if a human body or the like is near (see Patent Documents 1 to 3, for example).

Patent Document 1: Japanese Unexamined Patent Application Publication No. 2013-168790
Patent Document 2: Japanese Unexamined Patent Application Publication No. 2000-286924
Patent Document 3: Japanese Unexamined Patent Application Publication No. 8-97733

BRIEF SUMMARY

As described above, providing a wireless communication device with an antenna tuner has conventionally ensured matching between the antenna and the front end circuit, but with the communication bands which wireless communication devices are to handle continuing to expand, it has become necessary to ensure matching between the antenna and the front end circuit across a wider frequency band. As a result, there is increasing demand for an antenna tuner in which the impedance can be adjusted over a wide range.

However, widening the range over which the impedance can be adjusted in an antenna tuner requires increasing the number of control elements such as variable capacitors, which complicates the circuit scale of the antenna circuit, the control system, and so on. However, it is difficult to widen the range over which the impedance can be adjusted to levels currently in demand while maintaining a realistic scale for the antenna circuit, the control system, and so on.

In light of this, it is conceivable to provide some elements of the antenna tuner on the front end circuit side rather than in the antenna circuit. However, providing some of the elements (the variable matching circuit) of the antenna tuner in the front end circuit results in the normalized impedance of the front end circuit as viewed from the switch connector shifting away from the vicinity of 1, and thus matching with the measurement circuit cannot be achieved even if matching with the antenna circuit can.

Accordingly, the present disclosure provides a front end circuit and a wireless communication device capable of ensuring matching between a measurement circuit and a front end circuit even in the case where part of a variable matching circuit for matching with an antenna is provided on the front end circuit side.

A wireless communication device according to this disclosure includes a front end circuit and an antenna circuit. The front end circuit according to this disclosure includes a transmission port into which a transmission signal in a predetermined communication band is inputted, a reception port from which a reception signal in a predetermined communication band is outputted, and an antenna port from which the transmission signal is outputted and the reception signal is inputted. The front end circuit includes a shared antenna device connected between the antenna port, and the transmission port and the reception port.

The front end circuit also includes a variable matching circuit connected to the shared antenna device. The front end circuit also includes a measurement terminal connecting unit connected between the antenna port and the shared antenna device. Alternatively, the front end circuit includes a measurement terminal connecting unit connected between the antenna port and the variable matching circuit. Alternatively, the antenna circuit includes a measurement terminal connecting unit. The variable matching circuit has a plurality of matching circuits having mutually-different impedances, the matching circuits including a first matching circuit for matching near a normalized impedance of 1 and a second matching circuit for conjugate matching; and a connection selection unit that connects, to the shared antenna device, a matching circuit selected from the plurality of matching circuits.

The first matching circuit for matching near a normalized impedance of 1 is a circuit in which the impedance of the front end circuit as viewed from the measurement terminal connecting unit when the first matching circuit is selected by the connection selection unit is, in a predetermined communication band, closer to the impedance of a measurement circuit than when the second matching circuit is selected by the connection selection unit. In other words, the first matching circuit is a matching circuit that brings the normalized impedance as viewed from the measurement terminal connecting unit closer to 1. Accordingly, in a state where the first matching circuit is selected, it is easier to match the front end circuit and the measurement circuit (matching at 50Ω, for example), and the characteristics of the front end circuit can be measured more accurately.

On the other hand, the second matching circuit for conjugate matching is a circuit in which the impedance of the front end circuit as viewed from the antenna side when the second matching circuit is selected by the connection selection unit is, in a predetermined communication band, closer to a complex conjugate relationship with the impedance of the antenna circuit than when the first matching circuit is selected by the connection selection unit. Accordingly, in a state where the second matching circuit is selected, it is easier to match the front end circuit and the antenna circuit even when the antenna-side normalized impedance is not near 1, which makes it easier to achieve matching across a wide frequency range.

In the front end circuit according to this disclosure, a plurality of the second matching circuits can be provided, and each second matching circuit can have a different impedance. Alternatively, the second matching circuit can be a variable impedance circuit. The impedance changes depending on a state in the periphery of the antenna, and thus conjugate matching can be achieved between the antenna circuit and the front end circuit by adjusting the variable matching circuit to an impedance based on the state in the periphery of the antenna, even when the state in the periphery changes.

The front end circuit according to this disclosure can further include a transmission filter connected to the transmission port and a reception filter connected to the reception port. In addition, each of the transmission filter and the reception filter can be constituted of, for example, a tunable filter having a variable reactance element or a selectable filter having a switch and a plurality of filters. Doing so makes it possible to handle many communication bands even with a low number of elements.

The front end circuit according to this disclosure can further include a circulator connected between the transmission filter, the reception filter, and the variable matching circuit. Doing so increases isolation between the transmission filter and the reception filter using a small number of elements.

In the front end circuit according to this disclosure, the shared antenna device can be a diplexer that separates transmission signals and reception signals in a low-frequency communication band and transmission signals and reception signals in a high-frequency communication band. Through this, a plurality of types of communication bands can be handled, and furthermore, transmission signals can be transmitted and reception signal can be received across a wide band width using the low-frequency communication band and the high-frequency communication band simultaneously.

A wireless communication device according to this disclosure can include a proximity sensor that detects a state in which an object is near the antenna, and a control unit that controls the connection selection unit to select the second matching circuit when the proximity sensor has detected the state in which an object is near. Through this, changes in the impedance arising due to changes in the state of the antenna can be detected and the impedance of the front end circuit can be changed to a suitable impedance.

A wireless communication device according to this disclosure can include an impedance matching detection circuit provided in the antenna circuit or the front end circuit, and a control unit that controls the connection selection unit to select the second matching circuit when the impedance matching detection circuit has detected a state of impedance mismatching. Through this as well, changes in the impedance arising due to changes in the state of the antenna can be detected and the impedance of the front end circuit can be changed to a suitable impedance.

In the wireless communication device according to this disclosure, the antenna circuit can further include an antenna tuner connected between the antenna and the measurement terminal connecting unit; and that the antenna tuner be a variable impedance circuit and be controlled by the control unit. By using an antenna tuner along with a variable matching circuit provided in the front end circuit in this manner, a range across which the impedance can be adjusted can be widened to a demanded level even when there is a low number of control elements in the antenna tuner and the circuit scale of the antenna circuit, the control system, and so on are simple.

According to this disclosure, matching between a front end circuit and a measurement circuit can be ensured even in the case where a variable matching circuit for matching with an antenna is provided in the front end circuit.

DETAILED DESCRIPTION

Figure 1:
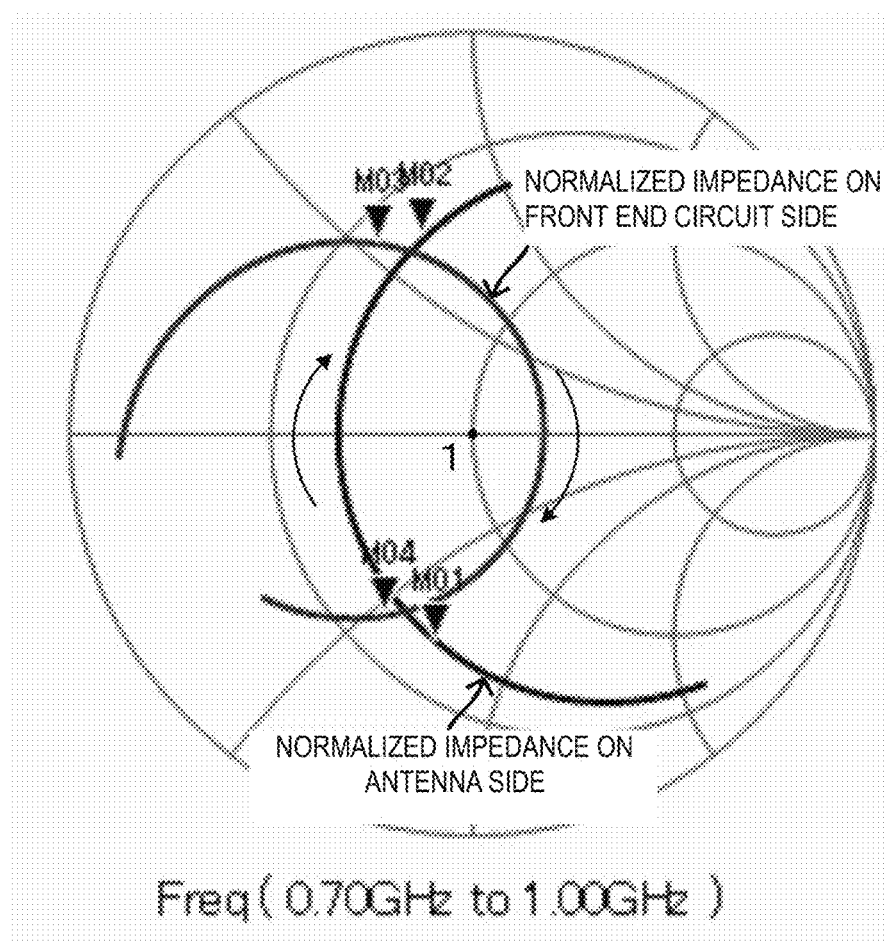
FIG. 1 is a diagram illustrating examples of impedance trajectories on a Smith chart in the case of conjugate matching between an antenna circuit and a front end circuit.

Conjugate matching will be described first. FIG. 1 is a diagram illustrating examples of the trajectory of an antenna-side normalized impedance and the trajectory of a front end circuit-side normalized impedance on a Smith chart. As the frequency increases, the antenna-side normalized impedance and the front end circuit-side normalized impedance move in the clockwise direction around a point on the Smith chart corresponding to a normalized impedance of 1 (the center of the Smith chart). The antenna-side normalized impedance and the front end circuit-side normalized impedance are in positions, in a predetermined communication band on a low-frequency band side and a predetermined communication band on a high-frequency band side respectively, where the imaginary parts thereof have opposite signs, and are close to being in a complex conjugate relationship. Matching between impedances having real parts and imaginary parts in this manner is called conjugate matching.

Figure 2:
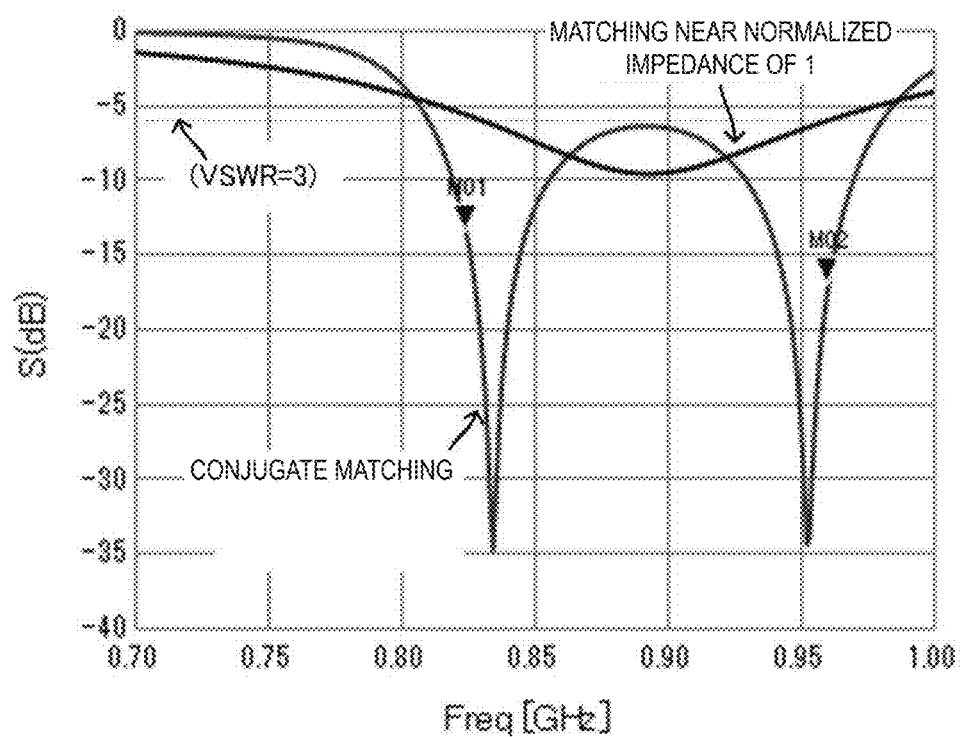
FIG. 2 is a diagram illustrating an example of return loss frequency characteristics by matching near a normalized impedance of 1, and by conjugate matching, between the antenna circuit and the front end circuit.

FIG. 2 is a diagram illustrating an example of frequency characteristics of return loss in the case of matching between the antenna circuit and the front end circuit near a normalized impedance of 1, and of return loss in the case of conjugate matching between the antenna circuit and the front end circuit. In the example illustrated in FIG. 2, a return loss lower than −6 dB (VSWR=3) can be realized in a frequency range from approximately 830 MHz to approximately 960 MHz by matching between the antenna circuit and the front end circuit at a normalized impedance near 1. On the other hand, a return loss lower than −6 dB (VSWR=3) can be realized in a frequency range from approximately 810 MHz to approximately 980 MHz by conjugate matching between the antenna circuit and the front end circuit. In other words, the antenna circuit and the front end circuit can be matched through conjugate matching even in frequency regions where the normalized impedance of the antenna circuit has shifted away from the vicinity of 1, which makes it possible to achieve matching across a wide frequency range.

Several embodiments for carrying out the present disclosure will be described hereinafter with reference to the drawings, using several specific examples. Corresponding elements in the drawings are given the same reference numerals. It goes without saying that the embodiments are merely examples, and that configurations described in different embodiments can replace each other or be combined as well.

First Embodiment

Figure 3:
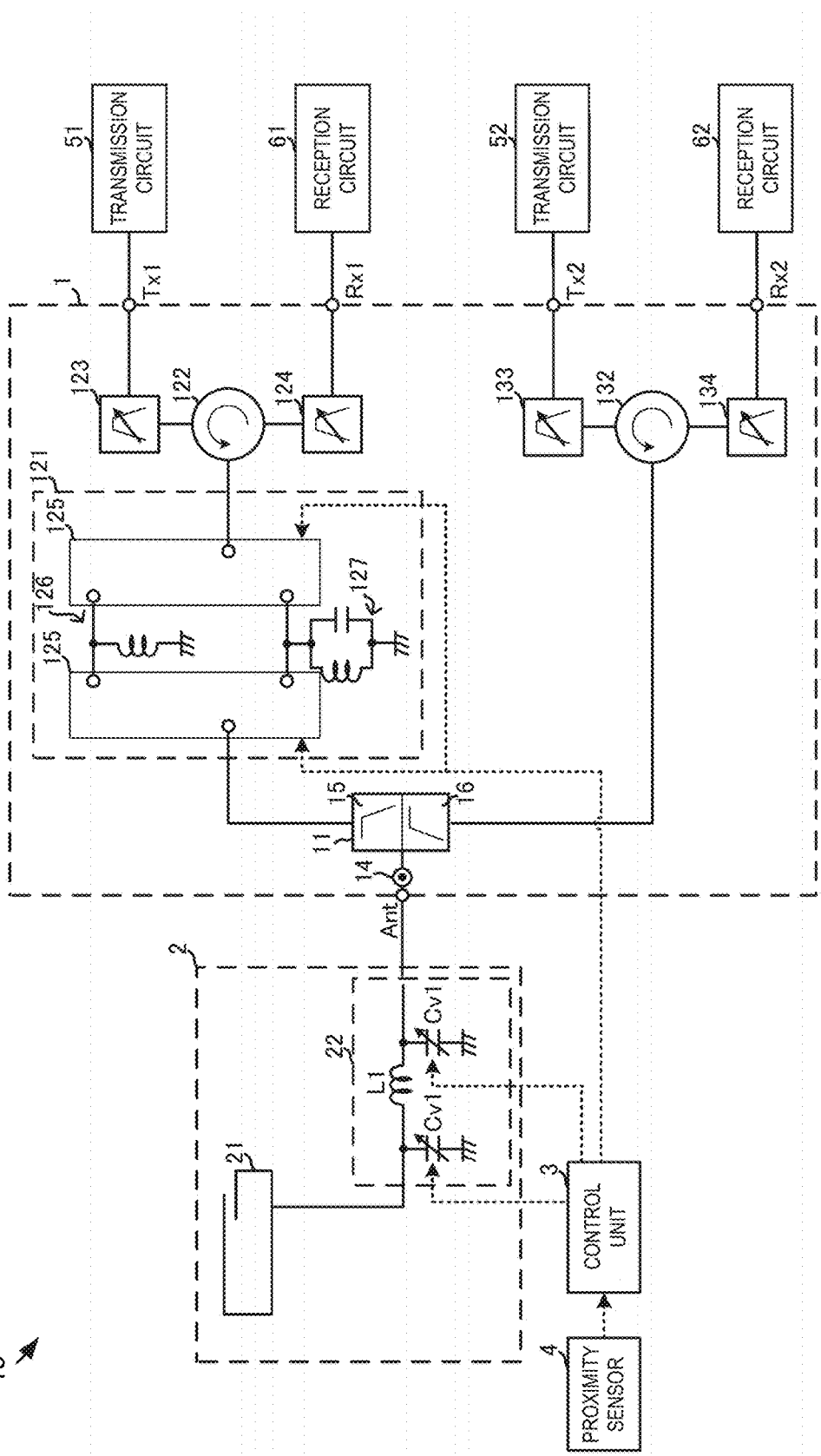
FIG. 3 is a circuit block diagram illustrating a wireless communication device including a front end circuit according to a first embodiment.

FIG. 3 is a circuit block diagram illustrating a front end circuit and a wireless communication device according to the present embodiment. A wireless communication device 10 according to the present embodiment transmits and receives using multiple communication bands on a low-frequency band side and multiple communication bands on a high-frequency band side. In the case of LTE, for example, a low-frequency band-side communication band is a communication band of approximately 1 GHz or lower. In the case of LTE, for example, a high-frequency band-side communication band is a communication band of approximately 1.4 GHz or higher.

The wireless communication device 10 includes a front end circuit 1, an antenna circuit 2, a control unit 3, a proximity sensor 4, transmission circuits 51 and 52, and reception circuits 61 and 62.

The front end circuit 1 transmits and receives in each communication band through the antenna circuit 2. As such, the front end circuit 1 has a transmission port Tx1, a reception port Rx1, a transmission port Tx2, a reception port Rx2, and an antenna port Ant as signal input/output ports. The transmission port Tx1 is connected to the transmission circuit 51. The reception port Rx1 is connected to the reception circuit 61. The transmission port Tx2 is connected to the transmission circuit 52. The reception port Rx2 is connected to the reception circuit 62. The antenna port Ant is connected to the antenna circuit 2.

The transmission circuit 51 handles transmission signals in a plurality of low-frequency communication bands, and outputs the transmission signals to the front end circuit 1 through the transmission port Tx1. The reception circuit 61 handles reception signals in a plurality of low-frequency communication bands, and receives the reception signals outputted by the front end circuit 1 through the reception port Rx1. The transmission circuit 52 handles transmission signals in a plurality of high-frequency communication bands, and outputs the transmission signals to the front end circuit 1 through the transmission port Tx2. The reception circuit 62 handles reception signals in a plurality of high-frequency communication bands, and receives the reception signals outputted by the front end circuit 1 through the reception port Rx2. The antenna circuit 2 receives transmission signals outputted by the front end circuit 1 through the antenna port Ant and outputs reception signals to the front end circuit 1 through the antenna port Ant.

The front end circuit 1 has a diplexer 11, a variable matching circuit 121, circulators 122 and 132, transmission filters 123 and 133, reception filters 124 and 134, and a switch connector 14 as internal elements.

Within the front end circuit 1, the switch connector 14 is provided at the antenna port Ant. The switch connector 14 is a measurement terminal connecting unit for measuring the transmission output, the reception sensitivity, and so on at the antenna port Ant. A terminal of a measurement circuit for measuring the transmission output, the reception sensitivity, and so on is connected to the switch connector 14 during product testing, inspection, and so on. The switch connector 14 has a function for switching the connection of the antenna port Ant from the antenna circuit 2 to the measurement circuit by connecting to the terminal of the measurement circuit.

The diplexer 11 is a shared antenna device, and is connected to the antenna port Ant within the front end circuit 1. The diplexer 11 has a low pass filter 15 and a high pass filter 16.

The variable matching circuit 121, the circulator 122, the transmission filter 123, and the reception filter 124 are connected to the low pass filter 15 side of the diplexer 11. Specifically, the low pass filter 15 is connected to the variable matching circuit 121. The low pass filter 15 has frequency characteristics allowing transmission signals and reception signals in the plurality of low-frequency communication bands to pass while blocking transmission signals and reception signals in the plurality of high-frequency communication bands between the variable matching circuit 121 and the antenna port Ant.

One end of the variable matching circuit 121 is connected to the low pass filter 15 of the diplexer 11, and another end is connected to the circulator 122. The impedance of the variable matching circuit 121 is variable and is controlled by the control unit 3.

The variable matching circuit 121 has a high-frequency switch 125 and matching circuits 126 and 127. The high-frequency switch 125 is a connection selection unit that selects one of the matching circuits 126 and 127 and connects that circuit in the signal path, and is controlled by the control unit 3. The matching circuits 126 and 127 are each constituted of passive elements, and have mutually-different impedances.

The circulator 122 has three connection terminals, each of which is connected to one of the transmission filter 123, the reception filter 124, and the variable matching circuit 121. Signal propagation directions among the three connection terminals of the circulator 122 are irreversible. Accordingly, the transmission filter 123, the reception filter 124, and the variable matching circuit 121 are connected to the three connection terminals of the circulator 122 so that a signal passes from the transmission filter 123 to the variable matching circuit 121 and a signal passes from the variable matching circuit 121 to the reception filter 124.

One end of the transmission filter 123 is connected to the circulator 122, and another end is connected to the transmission port Tx1 within the front end circuit 1. One end of the reception filter 124 is connected to the circulator 122, and another end is connected to the reception port Rx1 within the front end circuit 1. The transmission filter 123 and the reception filter 124 include variable capacitor elements such as digital tuning capacitors (DTC) or the like, and are band pass filters whose pass bands and stop bands are variable. The pass bands and stop bands of the transmission filter 123 and the reception filter 124 are controlled by the control unit 3.

The circulator 132, the transmission filter 133, and the reception filter 134 are connected to the high pass filter 16 side of the diplexer 11. Specifically, the high pass filter 16 is connected to the circulator 132. The high pass filter 16 has frequency characteristics allowing transmission signals and reception signals in the plurality of high-frequency communication bands to pass while blocking transmission signals and reception signals in the plurality of low-frequency communication bands between the circulator 132 and the antenna port Ant.

The circulator 132 has three connection terminals, each of which is connected to one of the transmission filter 133, the reception filter 134, and the diplexer 11. Signal propagation directions among the three connection terminals of the circulator 132 are irreversible. Accordingly, the transmission filter 133, the reception filter 134, and the diplexer 11 are connected to the three connection terminals of the circulator 132 so that a signal passes from the transmission filter 133 to the diplexer 11 and a signal passes from the diplexer 11 to the reception filter 134.

One end of the transmission filter 133 is connected to the circulator 132, and another end is connected to the transmission port Tx2 within the front end circuit 1. One end of the reception filter 134 is connected to the circulator 132, and another end is connected to the reception port Rx2 within the front end circuit 1. The transmission filter 133 and the reception filter 134 include variable capacitor elements such as digital tuning capacitors (DTC) or the like, and are band pass filters whose pass bands and stop bands are variable. The pass bands and stop bands of the transmission filter 133 and the reception filter 134 are controlled by the control unit 3.

The antenna circuit 2 has an antenna 21 and an antenna tuner 22. One end of the antenna tuner 22 is connected to the antenna port Ant of the front end circuit 1. The antenna 21 is connected to the antenna port Ant of the front end circuit 1 through the antenna tuner 22. In other words, the antenna 21 is connected to another end of the antenna tuner 22.

The antenna tuner 22 has one or more reactance elements, and at least one of the reactance elements is constituted of a variable reactance element such as a digital tuning capacitor (DTC) or the like whose value changes in response to a control signal. Alternatively, the antenna tuner 22 is constituted of a plurality of reactance elements having mutually-different values and a switch element that selects a predetermined one of the reactance elements.

For example, the antenna tuner 22 has two variable capacitors Cv1, which are digital tuning capacitors (DTC), and an inductor L1. One end of the inductor L1 is connected to the antenna 21, and another end is connected to the antenna port Ant of the front end circuit 1. One end of each the two variable capacitors Cv1 is connected to one of the ends of the inductor L1, and another end of each of the two variable capacitors Cv1 is grounded. The capacitance values of the variable capacitors Cv1 are variable, and are controlled by the control unit 3. In other words, the impedance of the antenna tuner 22 is variable, and is controlled by the control unit 3.

The proximity sensor 4 detects an amount of reflected infrared light, a capacitance value, or the like that changes in response to a housing (not shown) of the wireless communication device 10 approaching the hand, head, or the like of a person holding the housing.

The control unit 3 determines whether the antenna is in an antenna proximate state or an antenna non-proximate state on the basis of a change in a detection value from the proximity sensor 4. "Antenna proximate state" refers to a state where the hand, head, or the like of a person holding the housing is near the antenna 21. "Antenna non-proximate state" refers to a state where the hand, head, or the like of a person holding the housing is not near the antenna 21, and where the wireless communication device 10 is subjected to testing, inspection, and so on of the front end circuit 1, for example.

The control unit 3 controls the antenna tuner 22 of the antenna circuit 2 and the variable matching circuit 121 of the front end circuit 1 on the basis of whether the state is the antenna proximate state or the antenna non-proximate state. Through this, the control unit 3 changes the impedance of the front end circuit 1 and the impedance of the antenna circuit 2 to the appropriate impedances.

In the case where the control unit 3 has determined that the state is the antenna proximate state, the impedance of the antenna 21 changes greatly, resulting in a real part and an imaginary part in a predetermined communication band. Accordingly, upon detecting that the state will be the antenna proximate state on the basis of the output of the proximity sensor 4, the control unit 3 controls the antenna tuner 22 and the variable matching circuit 121 so as to conjugate-match the impedance of the front end circuit 1 as viewed from the antenna circuit 2 side (called a front end circuit-side impedance hereinafter) to the antenna-side impedance having an imaginary part.

In other words, in the antenna proximate state, the control unit 3 controls the antenna tuner 22 and the variable matching circuit 121 so that the front end circuit-side impedance shifts away from the normalized impedance near 1, and the front end circuit-side impedance and the antenna-side impedance are in a relationship near a complex conjugate relationship.

Accordingly, in the range across which the antenna-side impedance can be adjusted, conditions for matching to impedance having only a real part such as a normalized impedance of 1 need not be included, and the range across which the impedance of the antenna tuner 22 itself can be adjusted may be narrow. Accordingly, a configuration having a comparatively low number of elements in the variable capacitors Cv1 can be employed for the antenna tuner 22, which makes it possible to simplify the circuit scale of the antenna circuit 2, the control system, and so on.

Meanwhile, the impedance of the measurement circuit to be connected to the switch connector 14 is normally set to be 50Ω having only a real part. Accordingly, when the front end circuit-side impedance is set to have a real part and an imaginary part using the variable matching circuit 121, matching can no longer be achieved between the front end circuit 1 and the measurement circuit. As such, in the case where the control unit 3 can determine from the output of the proximity sensor 4 that the state is in the antenna non-proximate state, such as when connecting the measurement circuit to the switch connector 14 to carry out measurement testing, inspection, or the like, the control unit 3 controls the variable matching circuit 121 and the antenna tuner 22 in order to bring the front end circuit-side impedance closer to the measurement circuit-side impedance and achieve matching between the two. The characteristics of the front end circuit 1 can be accurately measured as a result.

<<Example of Control During Measurement>>

Specifically, when the current state is determined to be the antenna non-proximate state, the control unit 3 controls the variable matching circuit 121 to cause the high-frequency switch 125 to connect the matching circuit 126 to the signal path. The matching circuit 126 brings the front end circuit-side impedance near to the normalized impedance of 1 for a predetermined low-frequency band and a predetermined high-frequency band when connected to the signal path.

While the matching circuit 126 can bring the front end circuit-side impedance near the normalized impedance of 1 in all transmission and reception communication bands, the matching circuit 126 may bring the front end circuit-side impedance near the normalized impedance of 1 for only some communication bands. In this case, a plurality of matching circuits 126 can be provided corresponding to each communication band, and the control unit 3 carries out control to select one of the matching circuits 126 and connect that circuit in the signal path.

<<Example of Control when Antenna is Near>>

When the current state is determined to be the antenna proximate state, the control unit 3 controls the variable matching circuit 121 to cause the high-frequency switch 125 to connect the matching circuit 127 to the signal path. The matching circuit 127 is a matching circuit that brings the front end circuit-side impedance near to a complex conjugate relationship with the antenna-side impedance for a predetermined low-frequency band and a predetermined high-frequency band when connected to the signal path, so as to achieve conjugate matching.

While the matching circuit 127 can bring the front end circuit-side impedance near to a complex conjugate relationship with the antenna-side impedance in all transmission and reception communication bands, the matching circuit 127 may bring the front end circuit-side impedance near to a complex conjugate relationship with the antenna-side impedance for only some communication bands. In this case, a plurality of matching circuits 127 can be provided corresponding to each communication band, and the control unit 3 carries out control to select one of the matching circuits 127 and connect that circuit to the signal path.

As described thus far, in the wireless communication device 10 and the front end circuit 1 according to the present embodiment, even if the variable matching circuit 121 for matching with the antenna 21 is provided in the front end circuit 1, which has few restrictions in terms of circuit scale, control system, and so on, switching the connections to the matching circuit 126 for use during measurement and the matching circuit 127 for use when the antenna is near makes it possible to ensure matching between the front end circuit 1 and the measurement circuit while matching the front end circuit 1 and the antenna circuit 2 across a wide frequency range.

In the present embodiment, the isolation between the transmission filters 123 and 133 and the reception filters 124 and 134 can be improved by providing the circulators 122 and 132 between the transmission filters 123 and 133 and the reception filters 124 and 134. However, the circulators 122 and 132 can be omitted in the case where the transmission filters 123 and 133 and the reception filters 124 and 134 have frequency characteristics where almost no signal leakage occurs therebetween, the case where only communication bands having large differences in frequencies between the transmission signals and the reception signals are used, and so on. In addition, rather than providing a variable matching circuit only in the signal path on the low-frequency band side, a variable matching circuit may be provided in the signal path on the high-frequency band side, or variable matching circuits may be provided in both the signal path on the low-frequency band side and the signal path on the high-frequency band side.

Second Embodiment

Figure 4:
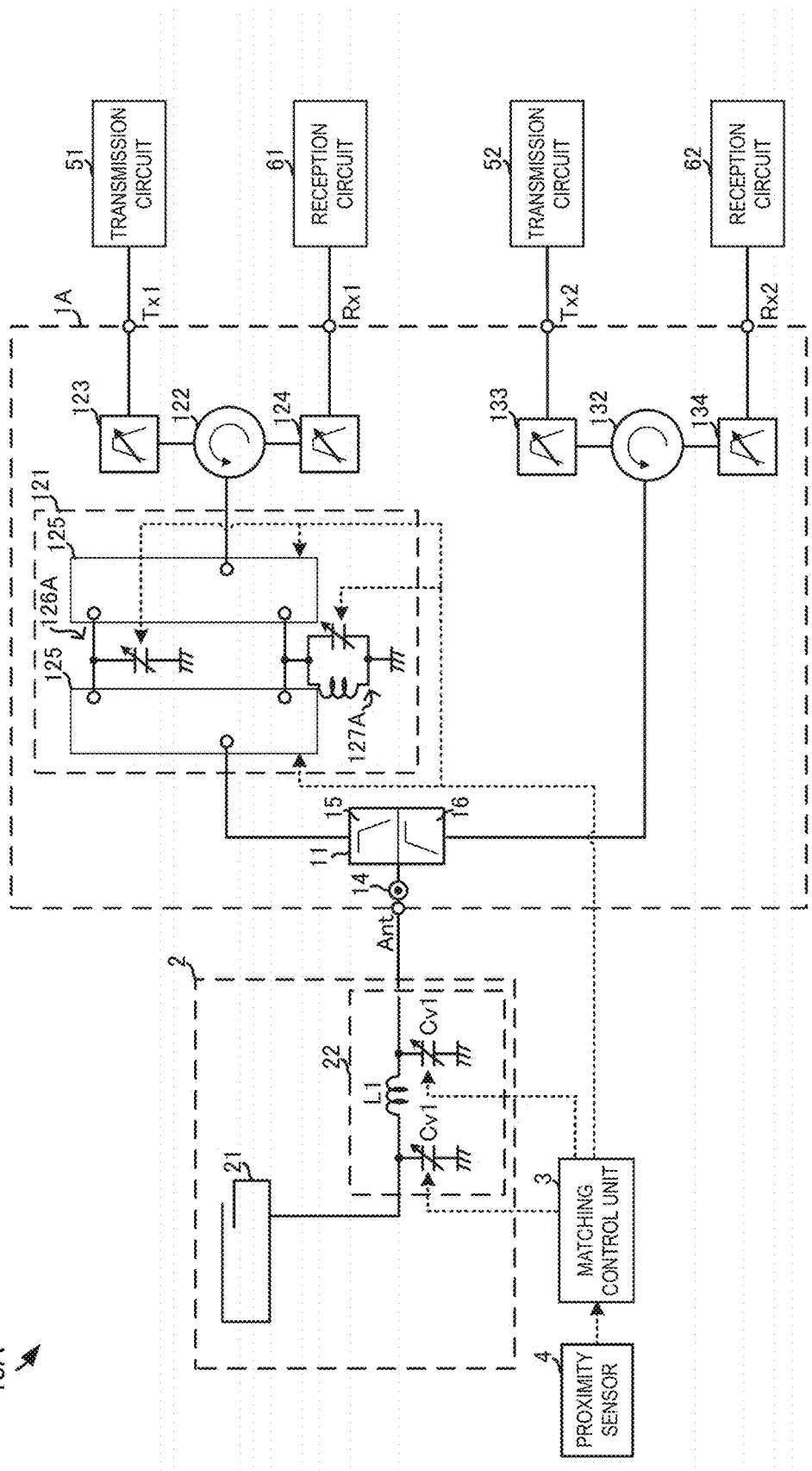
FIG. 4 is a circuit block diagram illustrating a wireless communication device including a front end circuit according to a second embodiment.

A wireless communication device 10A and a front end circuit 1A according to a second embodiment of the present disclosure will be described next. FIG. 4 is a circuit block diagram illustrating the wireless communication device 10A and the front end circuit 1A according to the present embodiment. The wireless communication device 10A and the front end circuit 1A include matching circuits 126A and 127A instead of the matching circuits 126 and 127 described in the first embodiment. The matching circuits 126A and 127A are variable impedance circuits having variable reactance elements such as digital tuning capacitors (DTC).

When the current state is determined to be the antenna non-proximate state, the control unit 3 controls the variable matching circuit 121 to cause the high-frequency switch 125 to connect the matching circuit 126A to the signal path. Meanwhile, when the current state is determined to be the antenna proximate state, the control unit 3 controls the variable matching circuit 121 to cause the high-frequency switch 125 to connect the matching circuit 127A to the signal path.

The matching circuit 126A is a matching circuit that matches the front end circuit-side impedance to the antenna-side impedance so as to be near a normalized impedance of 1 (near 50Ω, for example) for a predetermined low-frequency band and a predetermined high-frequency band when connected to the signal path. The matching circuit 126A has a capacitance value of its variable capacitor controlled by the control unit 3 in accordance with the communication band that is used, which makes it possible to change the corresponding communication band.

The matching circuit 127A is a matching circuit that brings the front end circuit-side impedance near to a complex conjugate relationship with the antenna-side impedance for a predetermined low-frequency band and a predetermined high-frequency band when connected to the signal path, so as to achieve conjugate matching. The matching circuit 127A has a capacitance value of its variable capacitor controlled by the control unit 3 in accordance with the communication band that is used, which makes it possible to change the corresponding communication band.

The wireless communication device and the front end circuit according to the present disclosure may be configured as described in the present embodiment. Note that the impedances of both the matching circuits 126A and 127A may be variable, or only the impedance of one may be variable.

Third Embodiment

Figure 5:
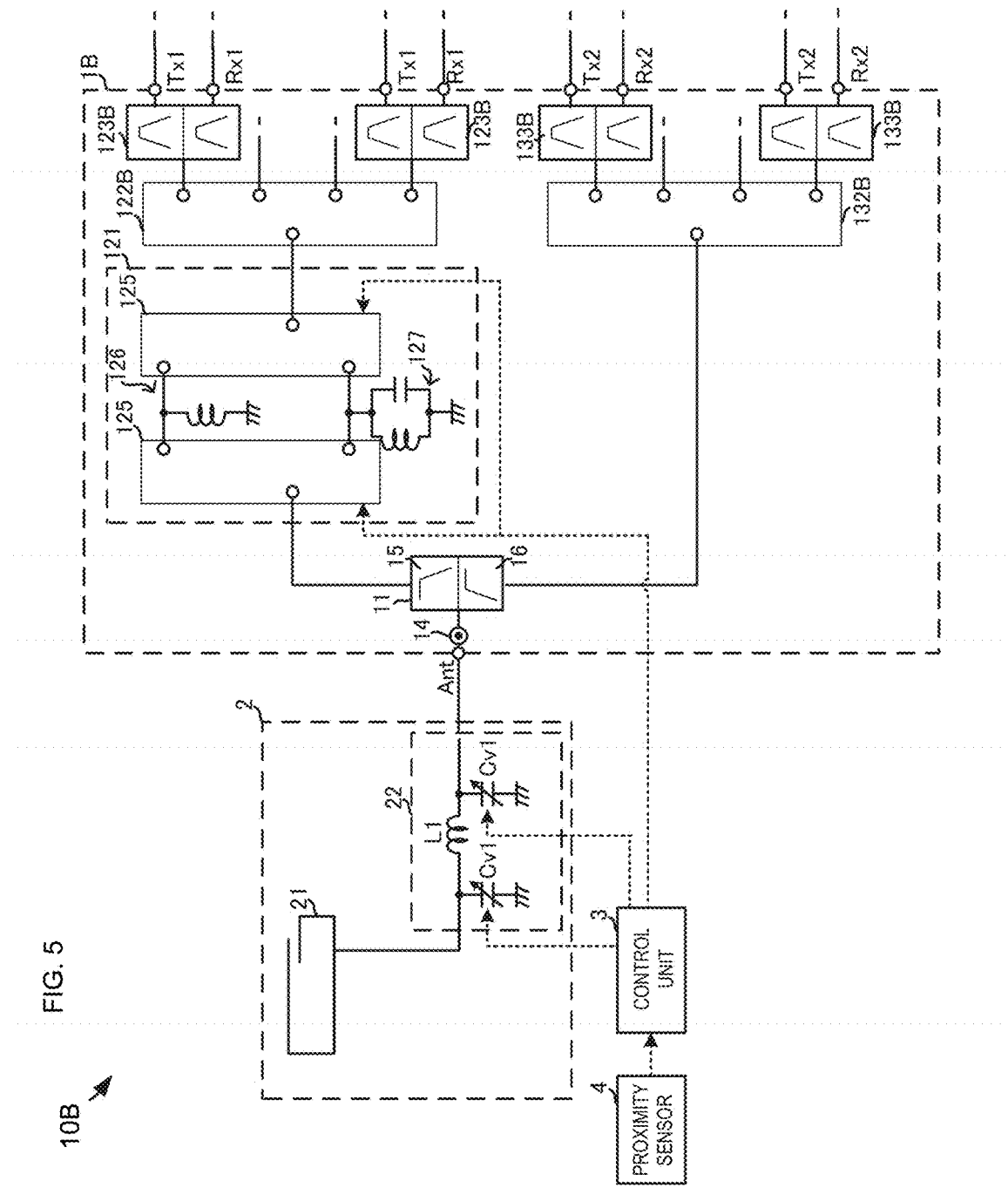
FIG. 5 is a circuit block diagram illustrating a wireless communication device including a front end circuit according to a third embodiment.

A wireless communication device 10B and a front end circuit 1B according to a third embodiment of the present disclosure will be described next. FIG. 5 is a circuit block diagram illustrating the wireless communication device 10B and the front end circuit 1B according to the present embodiment. The wireless communication device 10B and the front end circuit 1B have switchplexers 122B and 132B and pluralities of duplexers 123B and 133B, instead of the circulators 122 and 132 as well as the transmission filters 123 and 133 and the reception filters 124 and 134 according to the first embodiment. The plurality of duplexers 123B handles respective low-frequency communication bands, and is constituted by a transmission filter and a reception filter that take those communication bands as their pass bands. The plurality of duplexers 133B handles respective high-frequency communication bands, and is constituted by a transmission filter and a reception filter that take those communication bands as their pass bands. The switchplexer 122B handles low-frequency bands, is provided between the variable matching circuit 121 and the plurality of duplexers 123B, and selects and connects one of the duplexers 123B to the variable matching circuit 121. The switchplexer 132B handles high-frequency bands, is provided between the high pass filter 16 of the diplexer 11 and the plurality of duplexers 133B, and selects and connects one of the duplexers 133B to the high pass filter 16.

The wireless communication device and the front end circuit according to the present disclosure may be configured as described in the present embodiment. Note that as in the present embodiment, the pass bands of the transmission filter and the reception filter may be changed using switchplexers and duplexers in the configuration described above in the second embodiment as well.

Fourth Embodiment

Figure 6:
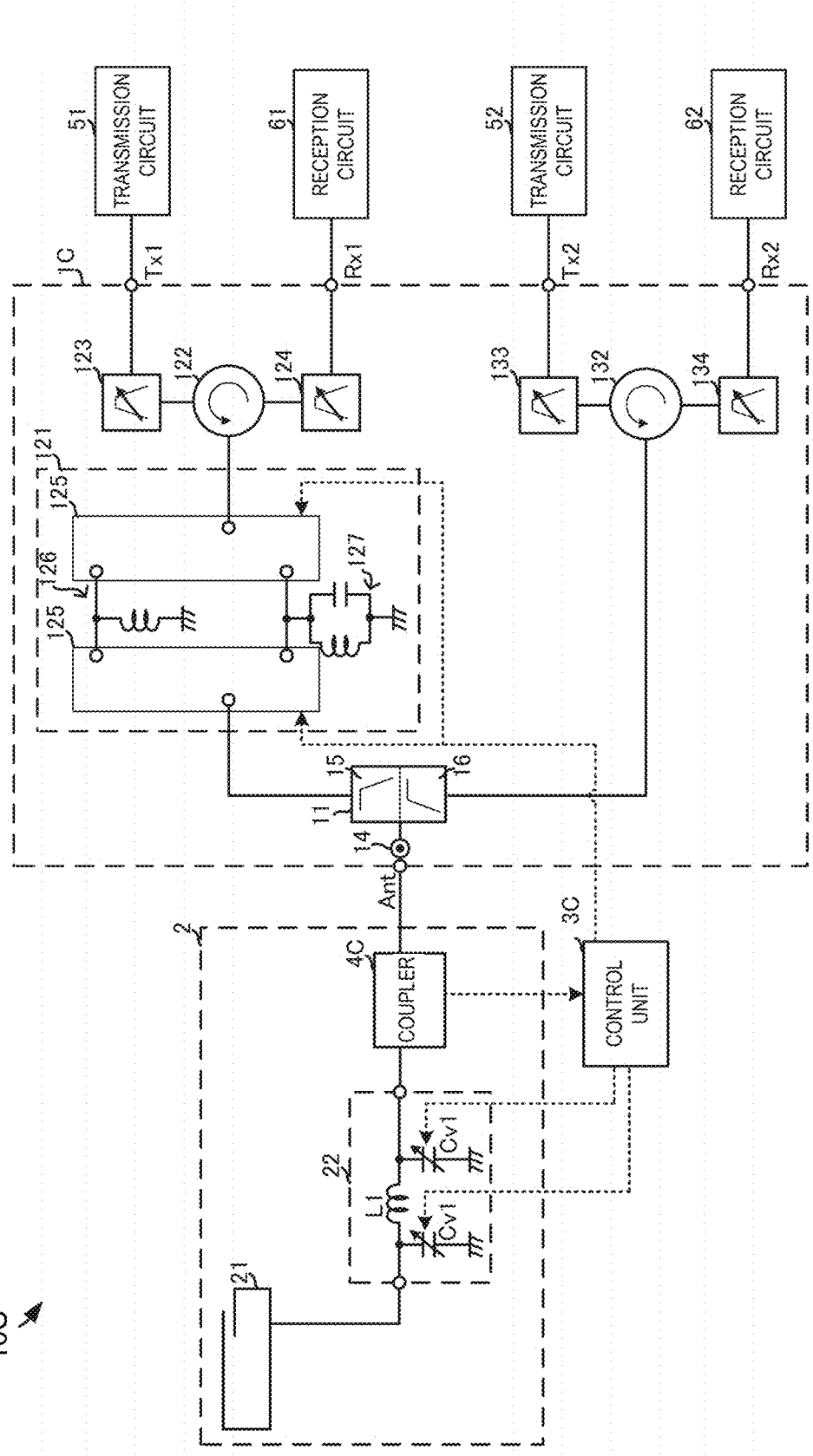
FIG. 6 is a circuit block diagram illustrating a wireless communication device including a front end circuit according to a fourth embodiment.

A wireless communication device 10C and a front end circuit 1C according to a fourth embodiment of the present disclosure will be described next. FIG. 6 is a circuit block diagram illustrating the wireless communication device 10C and the front end circuit 1C according to the present embodiment. The wireless communication device 10C and the front end circuit 1C include a control unit 3C and a coupler 4C instead of the control unit 3 and the proximity sensor 4 described in the first embodiment. The coupler 4C has a main line (not illustrated) connected between the front end circuit 1C and the antenna tuner 22, and a secondary line (not illustrated) that couples with the main line; the coupler 4C serves as an impedance matching detection circuit that obtains some of the power flowing in the main line. The control unit 3C determines whether or not a state of mismatching has occurred for the antenna 21 on the basis of the power obtained from the secondary line of the coupler 4C. For example, whether or not the voltage standing wave ratio (VSWR) is greater than or equal to a threshold is used to determine a state of impedance mismatching. The control unit 3C causes the variable matching circuit 121 to carry out switching for connecting the matching circuit 127 to the signal path in a state of mismatching.

The wireless communication device and the front end circuit according to the present disclosure may be configured as described in the present embodiment. Note that the position where the coupler 4C is provided may be in the antenna circuit 2 or in the front end circuit 1C. Likewise, in the case where the coupler 4C is provided in the front end circuit 1C, the coupler 4C may be provided further on the antenna side than the diplexer 11, or may be provided further on the side of the circulators 122 and 132 than the diplexer 11. Furthermore, as in the present embodiment, matching control may be carried out using a signal detected by a coupler in the configurations described above in the second embodiment and the third embodiment as well.

Fifth Embodiment

Figure 7:
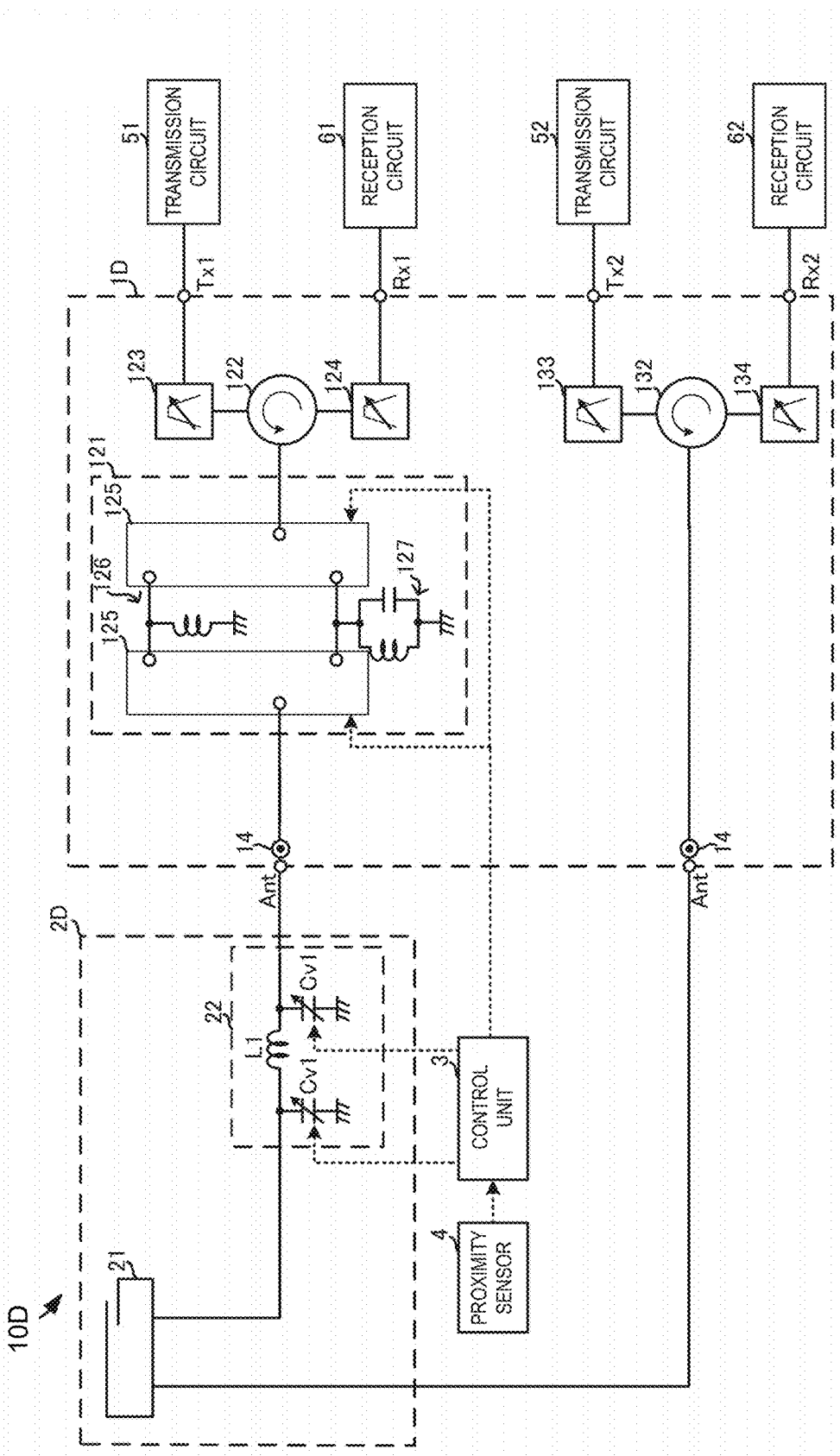
FIG. 7 is a circuit block diagram illustrating a wireless communication device including a front end circuit according to a fifth embodiment.

A wireless communication device 10D and a front end circuit 1D according to a fifth embodiment of the present disclosure will be described next. FIG. 7 is a circuit block diagram illustrating the wireless communication device 10D and the front end circuit 1D according to the present embodiment. The wireless communication device 10D and the front end circuit 1D omit the diplexer 11 described in the first embodiment and replace the antenna circuit 2 with an antenna circuit 2D. The antenna circuit 2D provides two power supply points, one for low frequencies and one for high frequencies, for the antenna 21. The antenna 21 may be constituted of a single element, or may be split into two elements, one for low frequencies and one for high frequencies. The circulator 122 is connected to the antenna circuit 2D through the variable matching circuit 121, and the circulator 132 is connected directly to the antenna circuit 2D. The antenna tuner 22 is provided only for the variable matching circuit 121.

The wireless communication device and the front end circuit according to the present disclosure may be configured as described in the present embodiment. Although the diplexers correspond to the shared antenna device in the previous embodiments, the circulators 122 and 132 correspond to the shared antenna device in the present embodiment. In addition, two power supply points, one for low frequencies and one for high frequencies, may be provided for the antenna in the configurations described above in the second to fourth embodiments as well, and the circulators 122 and 132 may then be connected to the antenna circuit 2 individually as in the present embodiment.

Sixth Embodiment

Figure 8:
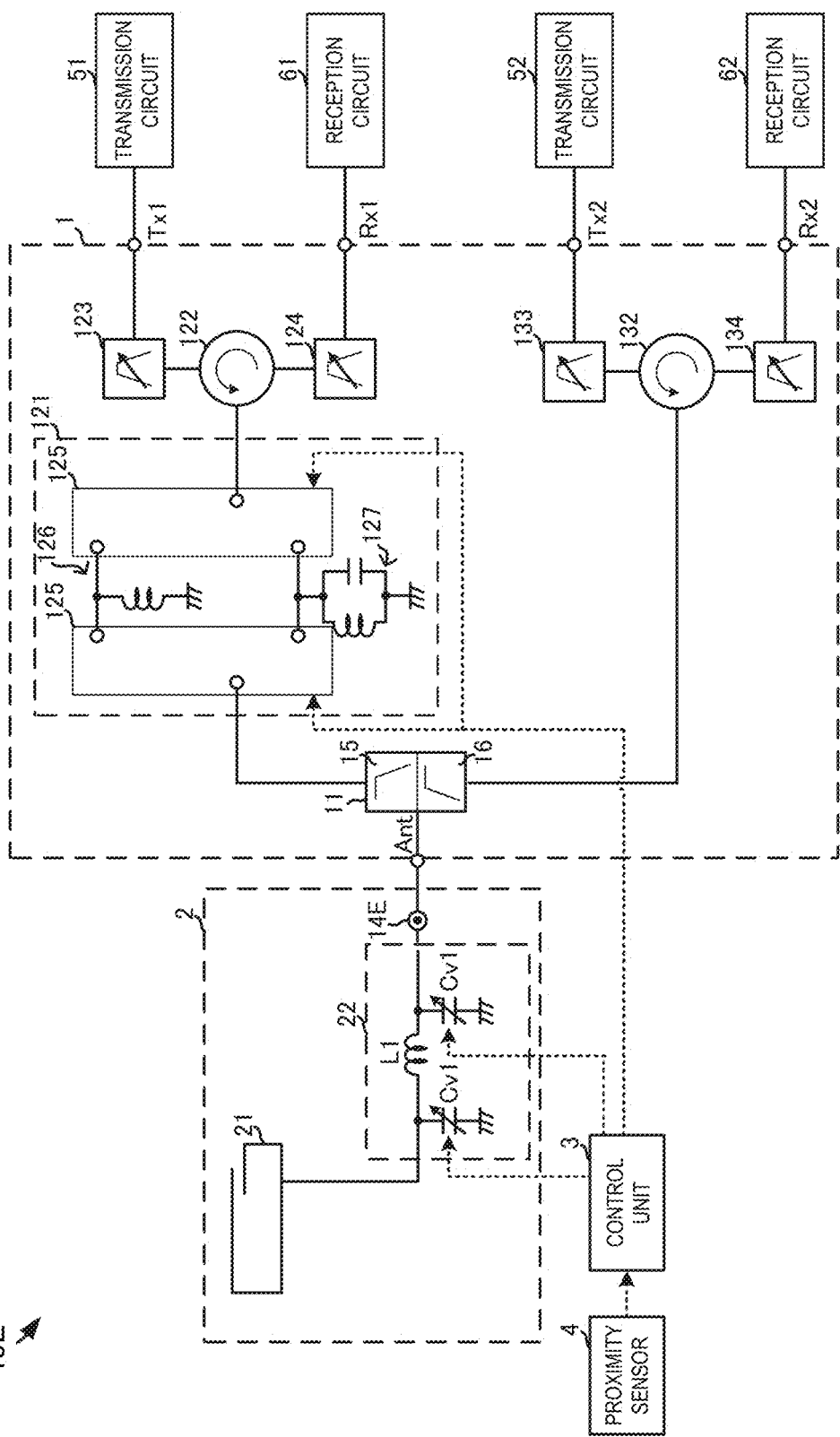
FIG. 8 is a circuit block diagram illustrating a wireless communication device according to a sixth embodiment.

A wireless communication device 10E according to a sixth embodiment of the present disclosure will be described next. FIG. 8 is a circuit block diagram illustrating the wireless communication device 10E according to the present embodiment. The wireless communication device 10E has a switch connector 14E instead of the switch connector 14 according to the first embodiment. The switch connector 14E is provided in the antenna circuit 2.

The wireless communication device according to the present disclosure may be configured as described in the present embodiment. Note that as in the present embodiment, the switch connector may be provided in the antenna circuit in the configurations described above in the second to fifth embodiments as well.

While the present disclosure can be carried out as described in the above embodiments, the present disclosure can be realized through any embodiment as long as that embodiment falls within the scope of the appended claims. For example, a variable matching circuit may be provided in the high-frequency band side circuit, or a variable matching circuit may be provided in both the low-frequency band side and high-frequency band side circuits.

REFERENCE SIGNS LIST

10 WIRELESS COMMUNICATION DEVICE
1 FRONT END CIRCUIT
11 DIPLEXER
121 VARIABLE MATCHING CIRCUIT
122, 132 CIRCULATOR
123, 133 TRANSMISSION FILTER
124, 134 RECEPTION FILTER
125 HIGH-FREQUENCY SWITCH
126, 127 MATCHING CIRCUIT
14 SWITCH CONNECTOR
15 LOW PASS FILTER
16 HIGH PASS FILTER
2 ANTENNA CIRCUIT
21 ANTENNA
22 ANTENNA TUNER
3 CONTROL UNIT
4 PROXIMITY SENSOR
51, 52 TRANSMISSION CIRCUIT
61, 62 RECEPTION CIRCUIT

The invention claimed is:

1. A front end circuit having a transmission port into which a transmission signal in a first predetermined communication band is inputted, a reception port from which a reception signal in a second predetermined communication band is outputted, and an antenna port from which the transmission signal is outputted and the reception signal is inputted, the front end circuit comprising:
   a shared antenna device connected between the antenna port, and the transmission port and the reception port;
   a variable matching circuit connected to the shared antenna device; and
   a measurement terminal connecting unit connected between the antenna port and the shared antenna device or between the antenna port and the variable matching circuit,
   wherein the variable matching circuit includes:
   a first matching circuit for matching near a normalized impedance of 1 and a second matching circuit for conjugate matching, the first matching circuit and the second matching circuit having mutually different impedances; and
   a connection selection unit that connects the first matching circuit or the second matching circuit to the shared antenna device.

2. The front end circuit according to claim 1, comprising a plurality of the second matching circuits, wherein each of the plurality of second matching circuits has a different impedance.

3. The front end circuit according to claim 1, wherein the second matching circuit is a variable impedance circuit.

4. The front end circuit according to claim 1, further comprising:
   a transmission filter connected to the transmission port and a reception filter connected to the reception port.

5. The front end circuit according to claim 4, further comprising:
   a circulator connected between the transmission filter and the reception filter.

6. The front end circuit according to claim 4, wherein the transmission filter and the reception filter are each constituted of a tunable filter having a variable reactance element or a selectable filter having a switch and a plurality of filters.

7. The front end circuit according to claim 1, wherein the shared antenna device is a diplexer that separates transmission signals and reception signals in a low-frequency communication band and transmission signals and reception signals in a high-frequency communication band.

8. A wireless communication device comprising:
   the front end circuit according to claim 1; and
   an antenna circuit that includes an antenna and is connected to the front end circuit through the antenna port.

9. A wireless communication device including a front end circuit, the front end circuit having a transmission port into which a transmission signal in a predetermined communication band is inputted, a reception port from which a reception signal in a predetermined communication band is outputted, and an antenna port from which the transmission signal is outputted and the reception signal is inputted, the wireless communication device comprising:
   an antenna circuit that includes an antenna and is connected to the front end circuit through the antenna port;
   a shared antenna device connected between the antenna port, and the transmission port and the reception port in the front end circuit;
   a variable matching circuit connected to the shared antenna device in the front end circuit; and
   a measurement terminal connecting unit provided in the antenna circuit,
   wherein the variable matching circuit includes:
   a first matching circuit for matching near a normalized impedance of 1 and a second matching circuit for conjugate matching, the first matching circuit and the second matching circuit having mutually different impedances; and
   a connection selection unit that connects the first matching circuit or the second matching circuit to the shared antenna device.

10. The wireless communication device according to claim 9, comprising:
   a proximity sensor that detects a proximity state of an object to the antenna; and
   a control unit that controls the connection selection unit to connect the second matching circuit to the shared antenna device when the proximity sensor has detected a proximity state in which an object is near the antenna.

11. The wireless communication device according to claim 9, comprising:

a proximity sensor that detects a proximity state of an object to the antenna; and a control unit that controls the connection selection unit to connect the second matching circuit to the shared antenna device when the proximity sensor has detected a proximity state in which an object is near the antenna.

12. The wireless communication device according to claim 9, comprising:

an impedance matching detection circuit provided in the antenna circuit or the front end circuit; and a control unit that controls the connection selection unit to connect the second matching circuit to the shared antenna device when the impedance matching detection circuit has detected an impedance mismatch.

13. The wireless communication device according to claim 9, comprising:

an impedance matching detection circuit provided in the antenna circuit or the front end circuit; and a control unit that controls the connection selection unit to connect the second matching circuit to the shared antenna device when the impedance matching detection circuit has detected an impedance mismatch.

14. The wireless communication device according to claim 10, wherein the antenna circuit further includes an antenna tuner connected between the antenna and the measurement terminal connecting unit; and the antenna tuner is a variable impedance circuit and is controlled by the control unit.

15. The wireless communication device according to claim 11, wherein the antenna circuit further includes an antenna tuner connected between the antenna and the measurement terminal connecting unit; and the antenna tuner is a variable impedance circuit and is controlled by the control unit.

16. The wireless communication device according to claim 12, wherein the antenna circuit further includes an antenna tuner connected between the antenna and the measurement terminal connecting unit; and the antenna tuner is a variable impedance circuit and is controlled by the control unit.

17. The wireless communication device according to claim 13, wherein the antenna circuit further includes an antenna tuner connected between the antenna and the measurement terminal connecting unit; and the antenna tuner is a variable impedance circuit and is controlled by the control unit.

* * * * *